United States Patent
Campagna

(10) Patent No.: US 7,092,834 B2
(45) Date of Patent: Aug. 15, 2006

(54) METHOD FOR DETERMINATION AND REPRESENTATION OF ADJUSTMENT STEPS FOR AN APPARATUS REQUIRING ADJUSTMENT

(75) Inventor: Swen Campagna, Engelthal (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/084,348

(22) Filed: Mar. 18, 2005

(65) Prior Publication Data

US 2005/0228602 A1 Oct. 13, 2005

(30) Foreign Application Priority Data

Mar. 19, 2004 (DE) .............. 10 2004 013 614

(51) Int. Cl.
G06F 19/00 (2006.01)
(52) U.S. Cl. .............. 702/107; 702/85; 702/105; 702/106; 702/107; 702/113; 702/114; 702/115; 700/273; 715/771
(58) Field of Classification Search .............. 702/85, 702/105–107, 113–115; 600/410, 647; 700/12, 700/23, 273; 715/771; 324/307
See application file for complete search history.

(56) References Cited

U.S. PATENT DOCUMENTS 6,148,293 A 11/2000 King
6,271,049 B1 8/2001 Auracher et al.
6,690,961 B1 * 2/2004 Kaufman et al. .......... 600/410
2002/0077968 A1 6/2002 Kaniwa et al.
2003/0069650 A1 * 4/2003 Karmiy et al. ............. 700/7

FOREIGN PATENT DOCUMENTS

| EP | 1 004 891 | 5/2000 |
|---|---|---|
| EP | 0622840 B1 * | 9/2000 |
| WO | WO 97/15840 | 5/1997 |
| WO | WO 03/021284 | 3/2003 |

* cited by examiner

Primary Examiner—Marc S. Hoff
Assistant Examiner—Phuong Huynh
(74) Attorney, Agent, or Firm—Schiff Hardin LLP

(57) ABSTRACT

In a method for determination and representation of adjustment steps for operation of an apparatus requiring adjustment, such as a diagnostic imaging apparatus, the implementation of manual adjustments by a user is supported. The method determines which adjustment steps are necessary for adjustment of the apparatus for a particular operation thereof and displays then in a list on a display medium. The adjustment steps are ordered corresponding to a sequence that is necessary for adjustment of the apparatus.

4 Claims, 1 Drawing Sheet

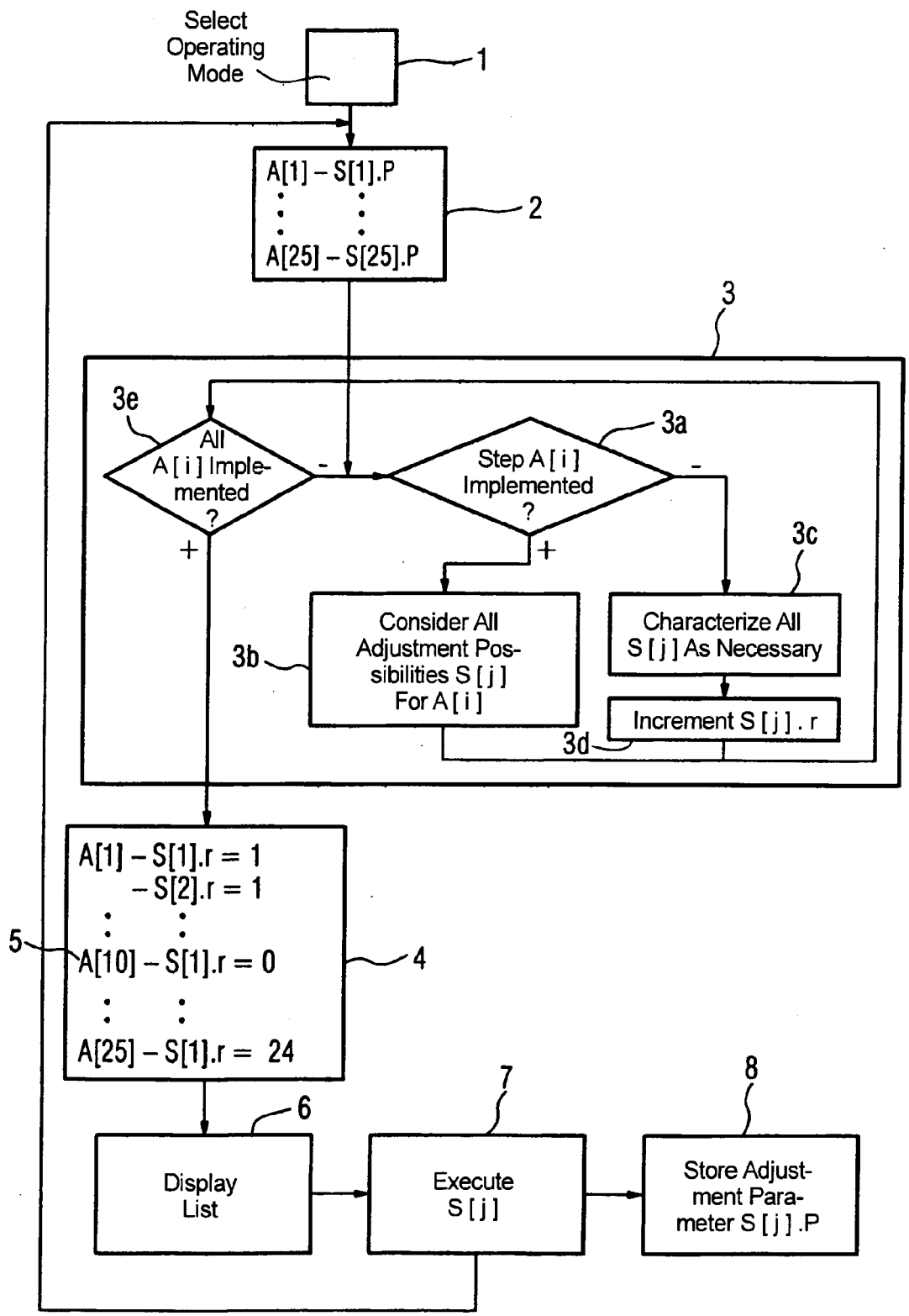

METHOD FOR DETERMINATION AND REPRESENTATION OF ADJUSTMENT STEPS FOR AN APPARATUS REQUIRING ADJUSTMENT

BACKGROUND OF THE INVENTION

1. Field of the Invention

The present invention concerns a method for determination and representation of adjustment steps for operation of an apparatus requiring adjustment.

2. Description of the Prior Art

Many apparatuses require an implementation of adjustments before their operation. This is in particular the case with diagnostic imaging apparatuses. For example, an adjustment is necessary before an examination by means of a magnetic resonance apparatus in order to tune it to a respective operating mode. In general, a number of different adjustment steps are necessary that can be automatically implemented by the diagnostic apparatus. For special operating modes, for example servicing, research or spectroscopy, however it is desirable for a user to also manually implement the adjustment steps. Due to the complex interaction of the numerous different adjustment steps, erroneous adjustments can occur, which the diagnostic apparatus can correct in a second automatic implementation of the necessary adjustment steps. For example, a type of adjustment known as a shim adjustment of a magnetic resonance apparatus, in which the magnetic field inhomogeneities are compensated, an adjustment of the resonance frequency is frequently necessary, even if this frequency had already been set before the shim adjustment. In this case, if the user overlooks the necessity of a repeated adjustment of the resonance frequency, the magnetic resonance apparatus automatically implements the necessary adjustment steps before a measurement. This is time-consuming and, under the circumstances, does not achieve the goal desired by the user of an adjustment adapted in particular to test purposes.

Adjustment steps also are explained in general in printed operating manuals for less complicated devices. An example is the operating manual of the LCD color monitor "FlexScan®" L367 by the company Eizo (2002, pages 22 through 28). Possible adjustment steps are executed in succession and explained in this operating manual. Thus a user is enabled to implement the adjustment of the color monitor himself or herself. A printed operating manual is satisfactory for such simple adjustments. In the case described above of the magnetic resonance apparatus, adjustment using the printed operating manual would be very elaborate and complicated, since the number of possible adjustment steps is significantly higher in comparison to the color monitor and the described dependencies exist between the individual adjustment steps.

SUMMARY OF THE INVENTION

An object of the present invention is to provide a method that makes the manual adjustments simple to implement for the user of a complex device and prevents erroneous adjustment as far as possible.

This object is achieved by a method according to the invention wherein a list of adjustment steps is automatically electronically generated in a computer, the adjustment steps being necessary for operation of an apparatus requiring adjustment, and from the list, the computer automatically electronically determines a sequence of adjustment steps, including a designation in the sequence of alternative possibilities for at least one of the adjustment steps. The adjustment steps are visually displayed on a display medium, with marking on the display of the sequence. One of the adjustment steps is implemented to make an adjustment to the apparatus, and thereafter an updated list is automatically electronically generated in the computer, containing the remaining adjustment steps in the original list, and the computer automatically electronically determines an updated sequence of the remaining adjustment steps and represents the updated list on the display medium.

A necessity for implementation of adjustment steps can be created by a number of circumstances. For example, it is possible that various examination methods that require different operating parameters are used during an examination by means of a magnetic resonance apparatus. Thus examinations could be respectively implemented by obtaining data from different locations of the patient, with different reception coils. In this case, a new adjustment of the magnetic resonance apparatus would be necessary for each examination. Likewise, as already mentioned it is possible that particular adjustments are necessary given special operating modes such as spectroscopy or servicing. Here it is particularly important to ease the manual implementation of the adjustment steps. A user can select the respective adjustment step to be implemented and execute the associated adjustment possibility in a simple manner using the representation on a display medium of a list of the adjustment steps that are necessary for an operation (for example a special diagnosis mode) and adjustment possibilities appertaining to this. The determination and representation of a sequence of adjustment steps to be implemented leads the user through the adjustment process, but at the same time gives the user the possibility to implement a different adjustment step than the one provided. In particular with magnetic resonance apparatuses, there are a number of adjustment possibilities for a few adjustment steps. A shim adjustment, for example, can be implemented as a 3D shim or an interactive shim. In this case, the corresponding adjustment possibilities appear at the same location in the sequence, for example both with the number "two". Upon consideration of the list, this immediately shows the user which adjustment possibilities are available for the respective adjustment step. After each implementation of one of the adjustment steps, an updated list of adjustment steps still to be implemented is generated. The sequence of the adjustment steps is likewise re-determined and both are shown on the display medium. This allows for the complex interaction of the various adjustment steps and significantly reduces the error rate of the manual implementation of adjustments. As explained above, after implementation of one adjustment step it can be necessary to repeat an already-implemented adjustment step.

In an embodiment of the method, adjustment parameters determined given the implementation of an adjustment step are stored in a databank. A status for each adjustment step is thereby available that can be considered in the generation of the list. Additionally, after generation of the list the databank that contains the status for every possible adjustment step can be queried. Adjustment steps that have already been successfully executed (for example in a preceding operation) thus can be omitted in the adjustment yet to be implemented. The corresponding adjustment steps are characterized (designated) as "already implemented" in the generated list.

DESCRIPTION OF THE DRAWING

The single FIGURE is a flow chart for explaining the inventive method.

DESCRIPTION OF THE PREFERRED EMBODIMENTS

According to the FIGURE, a list of all adjustment steps A[i] necessary for the respective operating mode is generated starting from the selection of a specific operating mode 1 in a step 2. The variable i thereby serves for numbering [numeration of] the individual adjustment steps A[i]: in the schematically-indicated list i□{1, . . . , 25}. A number of adjustment possibilities S[j] that can be alternatively executed are possibly considered for the implementation of an adjustment step S[j]. The parameter j serves in turn for the numbering of the alternative adjustment possibilities S[j] for an adjustment step A[i]. As explained, both a 3D shim (for example S[1]) and an interactive shim (for example S[2]) are, for example, possible for compensation of magnetic field inhomogeneities in the adjustment step "shim adjustment" of a magnetic resonance apparatus. The generated list contains a characterization of the adjustment step A[i] that has already been executed and requires no new execution. This is achieved via a query (not shown) of a databank that contains the status of the adjustment steps A[1]. The adjustment parameters S[j].P used in the implementation of the respective adjustment step A[i] which has already occurred using an adjustment S[j], thus for example settings for shim coils, are also held in the databank and are associated with the respective adjustment step A[i] in the generated list.

In a step 3, in a loop it is checked in step 3a for all adjustment steps A[i] of the list whether they have already been implemented. If this is the case, in a step 3b all adjustment possibilities S[j] that are considered for an execution of the respective adjustment step A[i] are characterized as unnecessary and associated with the corresponding adjustment parameter S[j].P. A sequence parameter S[j].r associated with the respective adjustment possibility S[j] is simultaneously set to the value "zero". For the case that the adjustment step A[i] has not yet been implemented or is to be re-executed, in a step 3c all considered adjustment possibilities S[j] are characterized as necessary. Moreover, a sequence parameter S[j].r that has an equal value for alternative adjustment possibilities S[j] is associated with each adjustment possibility S[j]. After this, in a step 3d the sequence parameter S[j].r is increased by the value "one". In a step 3e it is checked whether all adjustment steps A[i] of the list have already been executed. If so, the loop is ended. Otherwise the next adjustment step A[i+1] of the list follows. Thus each adjustment step A[i] of the list receives associated with a sequence parameter S[j].r using which the sequence of the various adjustment steps A[i] is established. Moreover, alternative adjustment possibilities S[j] of an adjustment step A[i] receive the same sequence parameter S[j].r. Adjustment steps A[i] that are not to be implemented do not occur in the sequence since their associated sequence parameter S[j].r exhibits the value "zero".

After all adjustment steps A[i] of the list have been checked within the loop, in a step 4 a list 5 (here shown schematically) of all adjustment possibilities S[j] that belong to the selected operating mode is generated. In a step 6, the list 5 is shown on a display medium (for example directly with a possibility for implementation and adjustment of the adjustment parameters S[j].P) in a form usable for the user and the sequence parameters S[j].r are correspondingly characterized in the sequence. The adjustment possibilities S[j] in which the sequence parameter S[j].r is set to "zero" are already executed and correspondingly characterized. The user thus is able to simply recognize which adjustment possibility S[j] must be executed next and which alternatives are offered to the user. Moreover, the user has the possibility to re-execute an already-executed adjustment possibility S[j] in order to effect a different adjustment. After the execution of an adjustment possibility S[j] in step 7, the adjustment parameters S[j].P selected during the execution of the adjustment possibility S[j] are stored in the databank in a step 8. The method simultaneously begins again with the creation of a list of necessary adjustment possibilities S[j] in step 2, since the various adjustment possibilities S[j], due to their complex interaction, can make other adjustment steps A[i] necessary after their execution. The updated values for the respective adjustment steps A[i] are thereby queries from the databank for the generation of the new list.

Although modifications and changes may be suggested by those skilled in the art, it is the intention of the inventor to embody within the patent warranted hereon all changes and modifications as reasonably and properly come within the scope of his contribution to the art.

I claim:

1. A computerized method for determining and representing adjustment steps for an apparatus requiring adjustment, comprising the steps of:
   automatically electronically generating a list of adjustment steps in a computer that are necessary for operation of an apparatus requiring adjustment;
   from said list, automatically electronically determining in said computer a sequence of adjustment steps with alternative possibilities for at least one of said adjustment steps being designated in said sequence;
   visually representing said adjustment steps on a display medium with marking on said display of said sequence; and
   implementing one of said adjustment steps to make an adjustment to said apparatus, and thereafter automatically electronically generating an updated list of remaining ones of said adjustment steps in said computer and automatically electronically determining an updated sequence of said remaining ones of said adjustment steps and representing said updated list on said display medium.

2. A method as claimed in claim 1 comprising, after implementing said adjustment step, electronically automatically determining an adjustment parameter dependent thereon and storing said adjustment parameter in an electronic data bank; and
   generating said list from said data bank and thereafter interrogating said data bank as to whether an adjustment step has been implemented and whether re-implementation thereof is necessary.

3. A method as claimed in claim 2 comprising electronically determining said updated sequence only for remaining ones of said adjustment steps still to be implemented.

4. A method as claimed in claim 1 comprising manually selecting an operating mode for said apparatus, and generating said list of said adjustment steps dependent on the selected operating mode.

* * * * *